United States Patent
Kaji et al.

(10) Patent No.: US 11,967,564 B2
(45) Date of Patent: Apr. 23, 2024

(54) METHOD FOR MANUFACTURING SEMICONDUCTOR DEVICE

(71) Applicant: DENSO CORPORATION, Kariya (JP)

(72) Inventors: Aiko Kaji, Kariya (JP); Haruhito Ichikawa, Kariya (JP); Shuhei Mitani, Kariya (JP); Tomohiro Mimura, Kariya (JP); Yukihiro Wakasugi, Toyota (JP); Narumasa Soejima, Nagakute (JP)

(73) Assignee: DENSO CORPORATION, Kariya (JP)

( * ) Notice: Subject to any disclaimer, the term of this patent is extended or adjusted under 35 U.S.C. 154(b) by 481 days.

(21) Appl. No.: 17/159,610

(22) Filed: Jan. 27, 2021

(65) Prior Publication Data
US 2021/0151385 A1 May 20, 2021

Related U.S. Application Data
(63) Continuation of application No. PCT/JP2019/029831, filed on Jul. 30, 2019.

(30) Foreign Application Priority Data
Jul. 30, 2018 (JP) ................. 2018-142658

(51) Int. Cl.
| | | |
|---|---|---|
| *H01L 23/544* | (2006.01) | |
| *H01L 21/04* | (2006.01) | |
| *H01L 29/16* | (2006.01) | |
| *H01L 29/45* | (2006.01) | |
| *H01L 29/66* | (2006.01) | |
| *H01L 29/78* | (2006.01) | |

(52) U.S. Cl.
CPC ........ *H01L 23/544* (2013.01); *H01L 21/0485* (2013.01); *H01L 29/1608* (2013.01); *H01L 29/45* (2013.01); *H01L 29/66068* (2013.01); *H01L 29/7813* (2013.01); *H01L 2223/54426* (2013.01)

(58) Field of Classification Search
CPC ............... H01L 21/0485; H01L 23/544; H01L 29/1095; H01L 29/1608; H01L 29/401; H01L 29/41741; H01L 29/41766; H01L 29/45; H01L 29/66734
USPC ....................................................... 438/602
See application file for complete search history.

(56) References Cited

U.S. PATENT DOCUMENTS

2017/0012109 A1* 1/2017 Akagi ............... H01L 29/66068
2017/0170288 A1* 6/2017 Kiyosawa ......... H01L 21/02378
2018/0096947 A1* 4/2018 Lee ..................... H10B 12/315

FOREIGN PATENT DOCUMENTS

| JP | H02-117124 A | 5/1990 |
| JP | H09-223656 A | 8/1997 |
| JP | H10-004139 A | 1/1998 |

(Continued)

*Primary Examiner* — Fazli Erdem
(74) *Attorney, Agent, or Firm* — POSZ LAW GROUP, PLC

(57) ABSTRACT

A method for manufacturing a semiconductor device includes: forming an insulating film on a surface of a semiconductor layer of a semiconductor substrate; forming a contact hole in the insulating film; forming a conductor material on the insulating film to be in contact with the semiconductor layer through the contact hole; and patterning the conductor material using an alignment key included in the conductor material.

18 Claims, 7 Drawing Sheets

(56) References Cited

FOREIGN PATENT DOCUMENTS

| JP | 2005-294776 A | 10/2005 |
|----|---------------|---------|
| JP | 2007-280978 A | 10/2007 |

\* cited by examiner

FIG. 5

| STRUCTURE | (1) Ti/TiN/AlSi / BPSG / SiC | (2) Ti/TiN/AlSi / SiC | (3) Ti/TiN/AlSi / BPSG / Si | (4) Ti/TiN/AlSi / Si |
|---|---|---|---|---|
| SURFACE IMAGE (MICROSCOPE) | | | | |
| HALF WIDTH (°) | 15.2764 | 0.4386496 | 14.61398 | 7.328217 |
| Ra (nm) | 20.504 | 3.748 | 19.578 | 19.671 |

METHOD FOR MANUFACTURING SEMICONDUCTOR DEVICE

CROSS REFERENCE TO RELATED APPLICATIONS

The present application is a continuation application of International Patent Application No. PCT/JP2019/029831 filed on Jul. 30, 2019, which designated the U.S. and claims the benefit of priority from Japanese Patent Application No. 2018-142658 filed on Jul. 30, 2018. The entire disclosures of all of the above applications are incorporated herein by reference.

TECHNICAL FIELD

The present disclosure relates to a method for manufacturing a semiconductor device.

BACKGROUND

As an example of a semiconductor device, a silicon carbide (hereinafter, SiC) semiconductor device is manufactured by forming an epitaxial layer on a SiC substrate and performing a predetermined semiconductor manufacturing process thereon. In the semiconductor manufacturing process, mask alignment is performed using an alignment key, and respective parts for constituting the SiC semiconductor device are formed at desired positions using the alignment key as a reference. Thus, a high quality SiC semiconductor device is manufactured.

SUMMARY

The present disclosure describes a method for manufacturing a semiconductor device using an alignment key. In the method, an insulating film is formed on a surface of a semiconductor layer of a semiconductor substrate, and a contact hole is formed in the insulating film. Further, a conductor material is formed on the insulating film to be in contact with the semiconductor layer through the contact hole. The conductor material is patterned using an alignment key included in the conductor material.

BRIEF DESCRIPTION OF DRAWINGS

FIG. 5 is a diagram summarizing structures (1) to (4) and measurement results of the structures (1) to (4) including surface images, half widths and surface roughness Ra.

DETAILED DESCRIPTION

Figure 1:
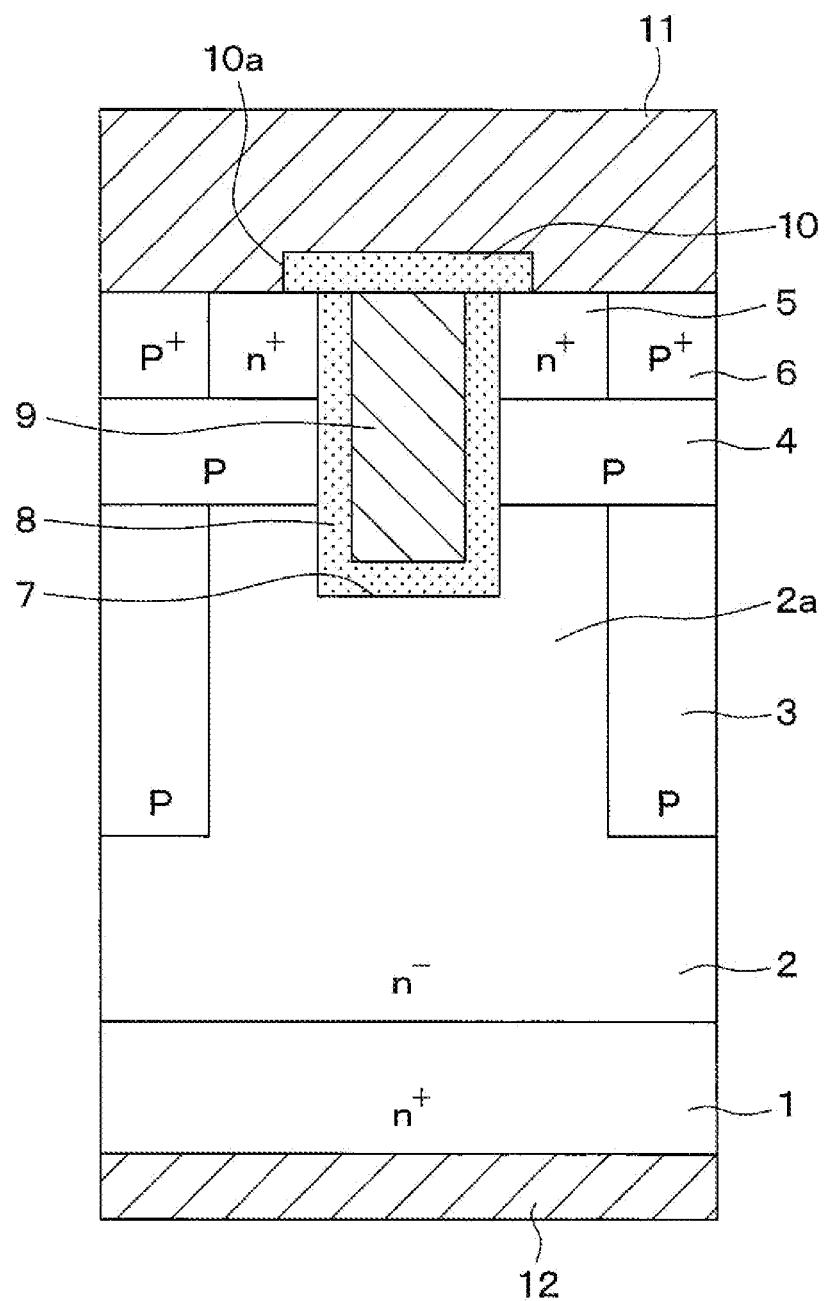
FIG. 1 is a cross-sectional view of a semiconductor device according to a first embodiment.

As an alignment key used in a semiconductor manufacturing process, for example, a trench formed on a SiC substrate or an epitaxial layer is used. The alignment key is recognized by a reading device called a stepper, and mask alignment is performed based on the result recognized. Specifically, after a trench as an alignment key is formed in a SiC substrate, respective parts are then formed by using a mask aligned using the alignment key as a reference. In the process, for example, an impurity layer is formed by implanting ions with alignment key used as a reference, and a conductor pattern such as an electrode is further formed via an interlayer insulating film. For example, in a case where the alignment key is provided by a trench, the recession of the trench is inherited in a SiC layer and an interlayer insulating film formed on the SiC substrate, and also in a conductor pattern formed thereon. Thus, the mask alignment can be performed each time by using the trench inherited as a new alignment key.

For example, in a case where a conductor pattern is formed via an interlayer insulating film after a semiconductor element is formed, the stepper is likely to misrecognize the alignment key due to the influence of grain boundaries of aluminum (Al) used as a conductor material. In such a case, it is thus difficult to accurately align the mask.

According to an embodiment of the present disclosure, a method for manufacturing a semiconductor device includes: forming an insulating film on a surface of a semiconductor substrate having a semiconductor layer; forming a contact hole in the insulating film; forming a conductor material on the insulating film to be in contact with the semiconductor layer through the contact hole; and patterning the conductor material. In the forming of the insulating film, the insulating film is formed on a surface of the semiconductor layer including a region corresponding to an alignment key formed on the semiconductor layer. After the forming of the insulating film, the insulating film is removed at a part including the region corresponding to the alignment key and its peripheral region so as to expose the semiconductor layer. In the forming of the conductor material, the conductor material is formed directly on the semiconductor layer exposed from the insulating film. In the patterning of the conductor material, the conductor material is patterned using the alignment key inherited to the surface of the conductor material as a reference.

In such a method, the part of the insulating film including the region that becomes the alignment key used for mask alignment for patterning the conductor material and a periphery of the region is removed, and the conductor material is formed on the insulating film and on the semiconductor layer at which the insulating film is removed. As a result, the reading accuracy of a stepper for recognizing the alignment key can be improved, and the alignment key can be recognized accurately.

According to an embodiment of the present disclosure, a method for manufacturing a semiconductor device includes: forming an insulating film on a surface of a semiconductor substrate having a semiconductor layer; forming a contact hole in the insulating film; forming a conductor material on the insulating film to be in contact with the semiconductor layer through the contact hole; and patterning the conductor material. After the forming of the insulating film, a part of the insulating film corresponding to a periphery of an alignment key is removed to expose the semiconductor layer on the periphery of the alignment key while leaving the insulating film in a region corresponding to the alignment key to form a dissimilar material portion. In the forming of the conductor material, the conductor material is formed on the insulting film to be in contact with the semiconductor layer through the contact hole and directly on the semiconductor layer exposed from the insulating film and the dissimilar material portion. In the patterning of the conductor material, a part of the conductor material formed on the dissimilar material portion is used as a new alignment key, based on a difference in crystallinity between the part of the conductor material formed directly on the dissimilar material portion and a part of the conductor material formed directly on the semiconductor layer.

Also in such a method, the reading accuracy of a stepper for recognizing the alignment key can be improved, and the alignment key can be recognized accurately.

Hereinafter, embodiments of the present disclosure will be described with reference to the drawings. In the embodiments described hereinafter, same or equivalent parts are designated with the same reference numerals.

First Embodiment

A first embodiment will be described. Here, a method for manufacturing a SiC semiconductor device provided with a conductor pattern will be described. Firstly, an example of a SiC semiconductor device to which the manufacturing method is applied will be described.

A SiC semiconductor device shown in FIG. 1 is formed with a vertical MOSFET as a semiconductor element. The vertical MOSFET is formed in a cell region of the SiC semiconductor device. Although the SiC semiconductor device is formed with an outer peripheral withstand voltage structure surrounding the cell region, only the vertical MOSFET is illustrated in FIG. 1. In the following description, a horizontal direction in FIG. 1 is referred to as a width direction, and a vertical direction is referred to as a thickness direction or a depth direction.

In the SiC semiconductor device, an $n^+$-type substrate 1 made of SiC is used as a semiconductor substrate. The $n^+$-type substrate 1 is composed of an off-substrate having a predetermined off-angle. For example, 4H or 6H—SiC having a surface orientation of the main surface of (0001) Si is used, and the <11-20> direction corresponds to an off direction. The off direction means "a direction parallel to a vector obtained by projecting a normal vector of the growth plane onto the (0001) plane".

On a front surface of the $n^+$-type substrate 1, an $n^-$-type low concentration layer 2 made of SiC and having an impurity concentration lower than that of the $n^+$-type substrate 1 is formed. The $n^-$-type low concentration layer 2 is connected to a JFET portion 2a having a narrow width at a position away from the $n^+$-type substrate 1. In the present disclosure, for the convenience of explanation, the $n^-$-type low concentration layer 2 and the JFET portion 2a are described as different structural parts. However, the $n^-$-type low concentration layer 2 and the JFET portion 2a both function as a drift layer. The JFET portion 2a may have the same impurity concentration as the $n^-$-type low concentration layer 2, or may have a different impurity concentration than the $n^-$-type low concentration layer 2.

On opposite sides of the JFET portion 2a, p-type deep layers 3 made of SiC are formed. The p type deep layers 3 have the same thickness as the JFET portion 2a.

Further, a p-type base region 4 made of SiC is formed on the JFET portion 2a and the p type deep layer 3. An $n^+$-type source region 5 made of SiC and a $p^+$-type contact region 6 made of SiC are formed on the p-type base region 4. The $n^+$-type source region 5 is formed on a portion of the p-type base region 4 corresponding to the JFET portion 2a. The $p^+$-type contact region 6 is formed on a portion of the p type base region 4 corresponding to the p-type deep layer 3.

Further, a gate trench 7 is formed to penetrate the p-type base region 4 and the $n^+$-type source region 5 and to reach the JFET portion 2a. The p-type base region 4 and the $n^+$-type source region 5 are disposed so as to be in contact with side surfaces of the gate trench 7. The gate trench 7 is formed in a linear layout defining a width direction in a right and left direction of FIG. 1, a longitudinal direction in one of directions normal to the plane of FIG. 1, and a depth direction in an up and down direction of FIG. 1. Although only one gate trench 7 is shown in FIG. 1, plural gate trenches 7 are arranged at an equal interval in the left and right direction of FIG. 1. Each of the gate trenches 7 is located between the p-type deep layers 3 to be in a stripe shape.

Further, a gate insulating film 8 is formed on an inner wall surface of the gate trench 7 including a channel region. The channel region is a portion of the p-type base region 4 located on a side surface of the gate trench 7, and serves as a region connecting the $n^+$-type source region 5 and the JFET portion 2a when the vertical MOSFET is in operation. A gate electrode 9 made of a doped poly-Si is formed on a surface of the gate insulating film 8. The gate trench 7 is filled with the gate insulating film 8 and the gate electrode 9. As a result, a trench gate structure is formed.

An interlayer insulating film 10 is formed on the surfaces of the $n^+$-type source region 5 and the $p^+$-type contact region 6 and the surface of the trench gate structure. Further, a source electrode 11 and a gate wiring layer (not shown) are formed on the interlayer insulating film 10 as a conductor pattern. The interlayer insulating film 10 is formed with a contact hole 10a to allow the source electrode 11 to be electrically in contact with the $n^+$-type source region 5 and the $p^+$-type contact region 6. In a cross-section different from the cross-section shown in FIG. 1, the interlayer insulating film 10 is formed with another contact hole to allow the gate wiring layer to be electrically connected to the gate electrode 9.

The source electrode 11 and the gate wiring layer are made of a conductor material, and are made of a plurality of metals such as Ni, Ti, TiNi, and Al. Portions of the source electrode 11 and the gate wiring layer, which are in contact with the n-type SiC, in particular, the $n^+$-type source region 5 or the gate electrode 9 in case of an n-doped type, are at least made of the metal that can have an ohmic contact with the n-type SiC, among the plurality of metals. Portions of the source electrode 11 and the gate wiring layer, which are in contact with the p-type SiC, in particular, the $p^+$-type contact region 6 or the gate electrode 9 in case of a p-doped type, are at least made of the metal that can have an ohmic contact with the p-type SiC, among the plurality of metals.

The interlayer insulating film 10 is made of an insulating film such as a $SiO_2$ film, and has a film thickness of, for example, 200 to 1000 nm. Examples of the $SiO_2$ film include a TEOS (tetraethoxysilane) film grown using TEOS, a BPSG (boro-phospho silicate glass) film to which boron (B) and phosphorus (P) are added, and a PSG film to which phosphorus is added.

Further, a drain electrode 12 is formed on a rear surface of the $n^+$-type substrate 1, and is electrically connected to the $n^+$-type substrate 1. With such a structure, a vertical MOSFET of an n-channel inverted type trench gate structure is provided. A cell region is formed by arranging the vertical MOSFET cells described above. An outer peripheral voltage withstand structure, such as a guard ring, is formed to surround the cell region in which the vertical MOSFET cells are arranged. In this way, the SiC semiconductor device is formed.

Next, a method for manufacturing the SiC semiconductor device formed as described hereinabove will be described. In manufacturing the SiC semiconductor device, a mask alignment is performed using an alignment key when each conductive layer or a trench gate structure is formed, and when the interlayer insulating film 10 is patterned. In this case, if the accuracy of the mask alignment is not sufficient, the characteristics of the SiC semiconductor device will be affected. In this case, the mask alignment is performed using a stepper, and it is necessary to accurately detect the alignment key when the source electrode 11 and the gate wiring layer are formed on the interlayer insulating film 10. Hereinafter, the method for manufacturing the SiC semiconductor device will be described with reference to the cross-sectional views of FIGS. 2A through 2F showing the manufacturing process, together with the description of mask alignment using the alignment key.

Figure 2A:
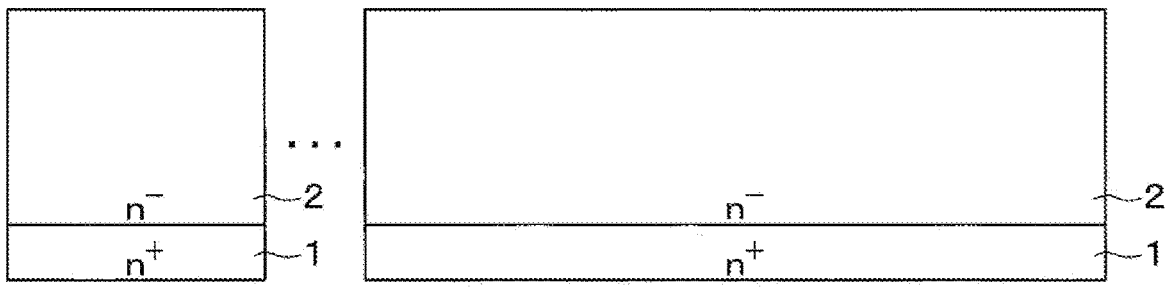
FIG. 2A is a cross-sectional view for showing a manufacturing process of the semiconductor device shown in FIG. 1.

[Step Shown in FIG. 2A]

First, an $n^+$-type substrate 1 is prepared as a semiconductor substrate. Then, an $n^-$-type low concentration layer 2, which is made of SiC, is formed on a main surface of the $n^+$-type substrate 1 by epitaxial growth. In the present embodiment, since a JFET portion 2a has the same impurity concentration as the $n^-$-type low concentration layer 2, the $n^-$-type low concentration layer 2 is epitaxially grown to have a thickness including the thickness of the JFET portion 2a, as the n-type SiC layer for forming the JFET portion 2a.

Figure 2B:
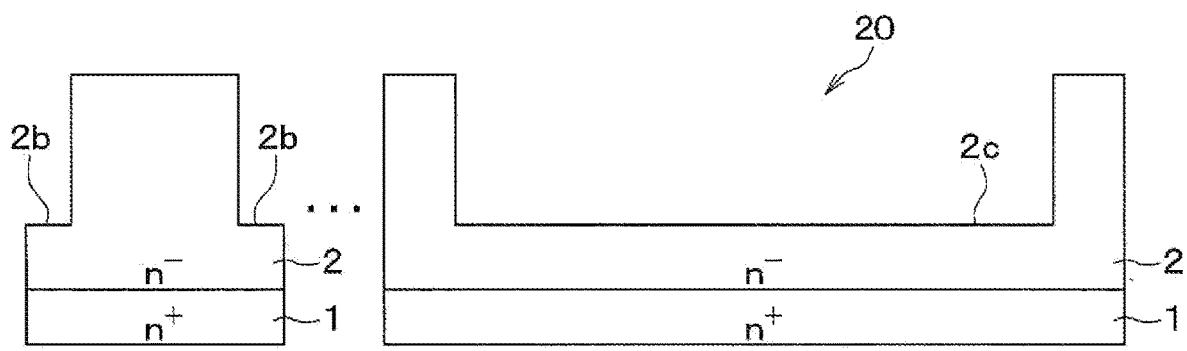
FIG. 2B is a cross-sectional view for showing the manufacturing process of the semiconductor device subsequent to FIG. 2A.

[Step Shown in FIG. 2B]

A trench 2b defining an opening at which a p-type deep layer 3 is to be formed is formed by etching the $n^-$-type low concentration layer 2 while covering a region where the JFET portion 2a is to be formed with a mask (not shown).

In this case, an alignment key 20 is formed at the same time as forming the trench 2b or is formed before forming the trench 20.

For example, the alignment key 20 is formed in a scribe region, which is cut out when a wafer is diced into chips to complete SiC semiconductor devices, or in an invalid region that is not used as a chip. In this case, the alignment key 20 is provided by a recessed portion 2c. Alternatively, the alignment key 20 can be provided by a projection that is made by forming a trench on its periphery. The depth of the recessed portion 2c is arbitrary, but is determined so that a depth of a recessed portion 21a, which is used as the alignment key 20 when a source electrode 11 and a gate wiring layer are finally formed by patterning the conductor material, is 1 micrometer (μm) or more. The shape of the alignment key 20 is arbitrary. In this case, the alignment key 20 has a stripe shape including multiple lines.

In the case where the alignment key 20 is formed at the same time as forming the trench 2b, the trench 2b is formed while positioning relative to the alignment key 20. In the case where the alignment key 20 is formed before forming the trench 2b, the alignment key 20 is recognized by the stepper, and the trench 2b is formed by performing the mask alignment with the alignment key 20 as a reference.

Figure 2C:
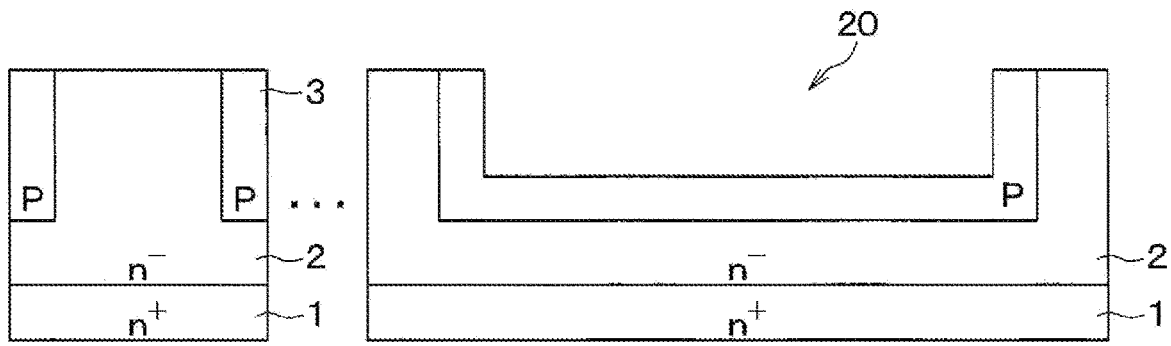
FIG. 2C is a cross-sectional view for showing the manufacturing process of the semiconductor device subsequent to FIG. 2B.

[Step Shown in FIG. 2C]

By epitaxially growing the p-type SiC, the p-type SiC is formed in the trenches 2b. As a result, the p-type deep layers 3 are formed in the trenches 2b, and the JFET portion 2a is located between the trenches 2b. In this case, the p-type deep layer 3 may be formed by a selective epitaxial growth masking a portion other than the trenches 2b, or may be formed by epitaxially growing a p-type SiC on the $n^-$-type low-concentration layer 2 including the inside of the trenches 2b and then flattening.

In this step, the p-type SiC can be formed also at the position corresponding to the alignment key 20. In this case, the p-type SiC inherits the unevenness on the surface of the recessed portion 2c, and the unevenness inherited serves as a new alignment key 20.

Figure 2D:
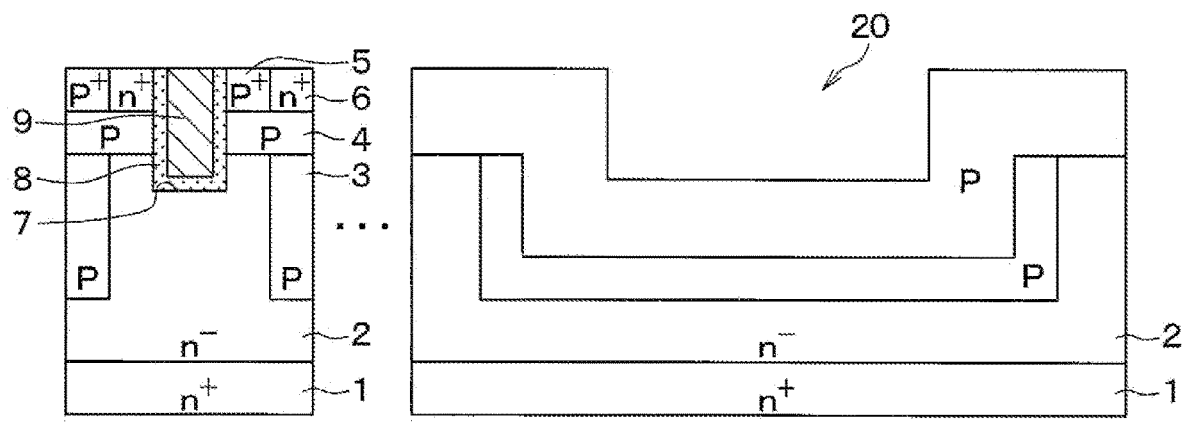
FIG. 2D is a cross-sectional view for showing the manufacturing process of the semiconductor device subsequent to FIG. 2C.

[Step Shown in FIG. 2D]

Subsequently, a p-type base region 4 is formed by epitaxially growing the p-type SiC on the surfaces of the JFET portion 2a and the p-type deep layer 3. At this time, the p-type SiC is also formed at the position corresponding to the alignment key 20. The unevenness of the surface of the region corresponding to the alignment key 20 is inherited to the p-type SiC, and thus the unevenness inherited serves as the new alignment key 20.

Then, by using a mask (not shown), an $n^+$-type source region 5 is formed by ion-implanting, for example, nitrogen or phosphorus as an n-type impurity into the surface layer portion of the p-type base region 4, and a $p^+$-type contact region 6 is formed by ion-implanting aluminum as the p-type impurity.

Further, after a mask (not shown) is formed on the $n^+$-type source region 5 or the like, a region of the mask where a gate trench 7 is to be formed is opened. Then, the gate trench 7 is formed by performing anisotropic etching, such as relative ion etching (RIE) or the like, using the mask.

The ion-implantation mask used in the ion implantation for forming the $n^+$-type source region 5 and the $p^+$-type contact region 6 and the etching mask used for forming the gate trench 7 are aligned using the alignment key 20 as a reference. Therefore, the positional deviation of the formation positions of the JFET portion 2a, the p-type deep layer 3, the n$^+$-type source region 5, the p$^+$-type contact region 6 and the gate trench 7 can be kept within a predetermined range.

Thereafter, the mask is removed, and a gate insulating film 8 is then formed, for example, by performing a thermal oxidation, so that the inner wall surface of the gate trench 7 and the surface of the n$^+$-type source region 5 are covered with the gate insulating film 8. Then, a poly-Si doped with a p-type impurity or an n-type impurity is deposited, and is then etched back to leave at least inside the gate trench 7, thereby forming the gate electrode 9.

Figure 2E:
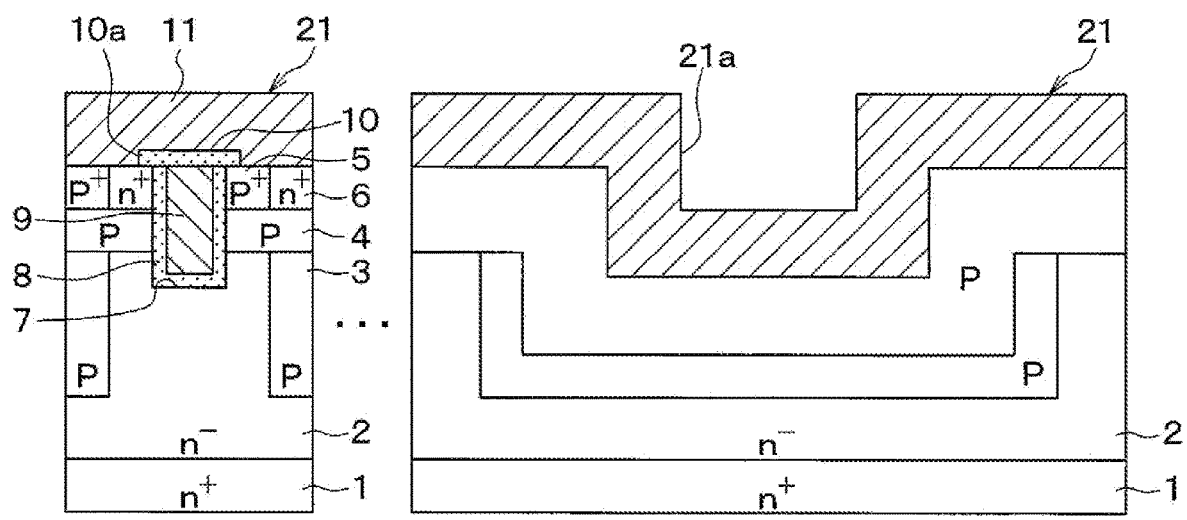
FIG. 2E is a cross-sectional view for showing the manufacturing process of the semiconductor device subsequent to FIG. 2D.

[Step Shown in FIG. 2E]

An interlayer insulating film 10, which is, for example, made of an oxide film, is formed so as to cover the surfaces of the gate electrode 9 and the gate insulating film 8. After a mask (not shown) is formed on the surface of the interlayer insulating film 10, a region of the mask corresponding to the p$^+$-type contact region 6 and the vicinity of the p$^+$-type contact region 6 is opened. Thereafter, the interlayer insulating film 10 is patterned using this mask, so that a contact hole for exposing the p$^+$-type contact region 6 and the n$^+$-type source region 5 is formed.

Then, an electrode material 21, which is for example made of a multi-layer structure of multiple metals, is formed on the surface of the interlayer insulating film 10. Thereafter, the electrode material 21 is patterned to form the source electrode 11 and the gate wiring layer.

Here, the patterning mask for forming the contact hole and the patterning mask for forming the source electrode 11 and the gate wiring layer are also aligned by using the alignment key 20. When the interlayer insulating film 10 is formed, the base layer under the interlayer insulating film 10, for example, the p-type base region 4 that has been formed also in the scribe region inherits the unevenness, that is, the recessed shape of the recessed portion 2c serving as the alignment key 20. Therefore, the interlayer insulating film 10 formed thereon also inherits the unevenness. As a result, the unevenness of the interlayer insulating film 10 can be used as the alignment key 20. Further, when the conductor material 21 is formed on the interlayer insulating film 10, the conductor material 21 also inherits the unevenness of its base layer. Therefore, a recessed portion 21a remains in the conductor material 21. In a conventional method, this recessed portion 21a was used as the alignment key 20.

However, it was confirmed that, if the recessed portion 21a inherited in the interlayer insulating film 10 or in the conductor material 21 formed on the interlayer insulating film 10 is used as the alignment key 20, the stepper cannot accurately recognize the recessed portion 21a and may erroneously recognize, resulting in inaccurate mask alignment.

Therefore, the present inventors conducted trial experiments and investigated the cause. Although the cause will be described later, the present inventors have found that the stepper can accurately recognize the alignment key 20 when the conductor material 21 is formed after removing the interlayer insulating film 10 in the region corresponding to the alignment key 20 and a periphery of the region. Therefore, the conductor material 21 is formed not on the interlayer insulating film 10, but on the SiC, which is the base layer of the interlayer insulating film 10, so that the conductor material 21 inherits the unevenness of the base layer. Thus, the recessed portion 21a of the conductor material 21 inherited from the unevenness of the base layer is used as the new alignment key 20.

Accordingly, it is possible to improve the reading accuracy of the alignment key 20, when the alignment key 20 is recognized by the stepper, and thus the alignment key 20 can be accurately recognized. As such, the mask alignment can be accurately performed, and the source electrode 11 and the gate wiring layer can be accurately formed at desired positions. Further, as described above, the depth of the recessed portion 21a of the conductor material 21 is made to be 1 μm or more based on the depth of the recess portion 2c formed in the n$^-$-type low concentration layer 2. Therefore, in the recognition of the alignment key 20 using the stepper, the SN ratio is improved and the recognition can be more accurately performed.

Although subsequent steps are not illustrated, the drain electrode 12 is formed adjacent to the rear surface of the n$^+$-type substrate 1. In this way, the SiC semiconductor device according to the present embodiment is completed.

According to the manufacturing method described above, it is possible to accurately form the source electrode 11 and the gate wiring layer at desired positions by the accurate mask alignment.

As described above, if the unevenness inherited in the conductor material 21 formed on the interlayer insulating film 10 is used as the alignment key 20, the stepper will erroneously recognize the alignment key 20. On the other hand, as in the present embodiment, in the case where the conductor material 21 is formed after removing the interlayer insulating film 10 in and around the region corresponding to the alignment key 20, and the unevenness inherited in the conductor material 21 is used as the alignment key 20, the stepper will not cause the misrecognition. The reason will be described hereinafter with reference to a comparative example.

First, as the comparative example, the interlayer insulating film 10 was formed on the p-type base region 4 as the base layer, and the conductor material 21 was then formed thereon without removing the interlayer insulating film 10 in and around the region corresponding to the alignment key 20. As the conductor material 21, an Al-containing layer containing Al or AlSi was formed in addition to Ti/TiN. The "Ti/TiN" is a laminated film of Ti for enhancing the adhesion to the base layer and TiN as a barrier metal. The Al-containing layer is a metal layer generally used for electrodes and wiring. A vertical MOSFET as in the present embodiment is applied with a high voltage and a high current as a power device. Therefore, the conductor material 21 is relatively thick, and has a thickness of 6 μm or more, for example.

Figure 3A:
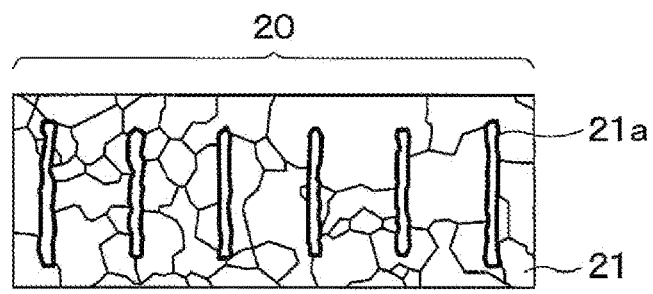
FIG. 3A is a view of a part of a semiconductor device corresponding to an alignment key as a comparative example, observed with an electron microscope, in which a conductor material is formed without removing an interlayer insulating film at the part.
Figure 3B:
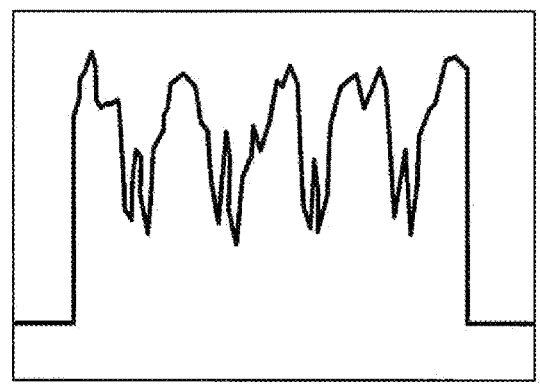
FIG. 3B is a diagram showing a waveform detected by a stepper in the structure shown in FIG. 3A.

FIG. 3A is a diagram showing the state of the alignment key 20 of the comparative example, when observed with an electron microscope. In this case, the recessed portions 21a forming the alignment key 20 have a stripe pattern including a plurality of lines. As shown in FIG. 3A, the recessed portions 21a formed in the conductor material 21 as the alignment key 20 have distortion, as well as the crystallinity on the peripheries of the recessed portions 21a are deteriorated as cracks. As a result, the waveform of the alignment key 20 detected by the stepper has the result as shown in FIG. 3B. As such, the alignment key 20 cannot be recognized accurately, and the accuracy of mask alignment deteriorates.

Figure 4A:
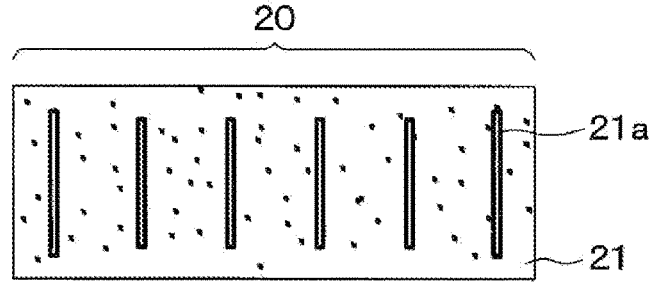
FIG. 4A is a view of a part of a semiconductor device corresponding to an alignment key of the first embodiment, observed with an electron microscope, in which a conductor material is formed after removing an interlayer insulating film.
Figure 4B:
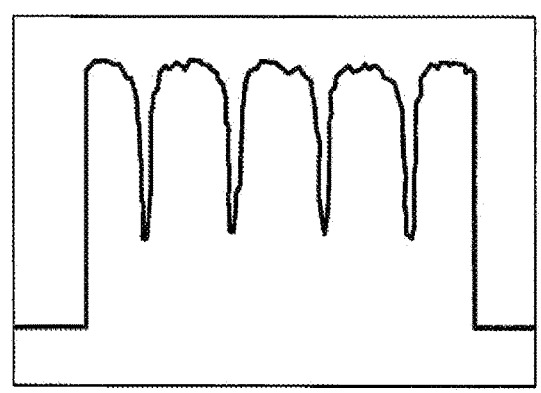
FIG. 4B is a diagram showing a waveform detected by a stepper in the structure shown in FIG. 4A.

In the present embodiment, on the other hand, the conductor material 21 is formed after removing the part of the interlayer insulating film 10 including the region corresponding to the alignment key 20 and a periphery of the region. FIG. 4A is a diagram showing the state of the alignment key 20 of that case where the conductor material 21 is formed after removing the interlayer insulating film 10, when observed with an electron microscope. As shown in FIG. 4A, the recessed portions 21a formed in the conductor material 21 as the alignment key 20 have straight linear shapes with almost no distortion. Also, the deterioration of crystallinity is not found around the recessed portions 21a. Further, the waveform of the alignment key 20 detected by the stepper has the result as shown in FIG. 4B. As such, the alignment key 20 can be accurately recognized, and the accuracy of mask alignment can be improved.

Although the mechanism leading to such results are not clear, it is estimated that, in a case where the base layer underneath the conductor material 21 is the interlayer insulating film 10, the interlayer insulating film 10 does not inherit the crystallinity of SiC, which is the base layer of the interlayer insulating film 10, and hence the crystallinity of the conductor material 21 thereon deteriorates.

As described above, the $n^+$-type substrate 1 having a (0001) Si surface as the front surface is used, and the surfaces of various SiC parts formed on the $n^+$-type substrate 1 are also (0001) Si surfaces. That is, the SiC parts formed on the $n^+$-type substrate 1 have the orientation equivalent to that of Si (111) and the lattice constant of 2.5 to 3.5 nm. In this case, in the case where Al contained in the Al-containing layer has an Al (111) orientation oriented in the A plane direction, Al and Si in the SiC have close orientations to each other, and thus the interstitial distance therebetween is short. Therefore, it is considered that Al is well oriented. On the other hand, in a case where the interlayer insulating film 10 is made of boron phosphorus silicon glass (BPSG), since the orientation of Al contained in the Al-containing layer and the orientation of Si in the interlayer insulating film 10 are different, the difference in interstitial distance is large. Therefore, it is considered that Al is not well oriented.

Therefore, in the case where the conductor material 21 is formed on the interlayer insulating film 10, the crystallinity deteriorates, and the recessed portions 21a serving as the alignment key 20 are deformed. Further, the crystallinity around the recessed portions 21a deteriorate as cracks. In particular, in a power device, the conductor material 21 is thick. For example, the conductor material 21 has a thickness of 6 μm or more. In such a case, the recessed portions 21a are filled and become shallower, encouraging erroneous recognition by the stepper.

On the contrary, in the case where the conductor material 21 is formed after removing the part of the interlayer insulating film 10, the crystallinity is improved, and the distortion of the recessed portions 21a serving as the alignment key 20 is reduced. Moreover, the crystallinity is also favorable around the recessed portions 21a. Therefore, it is considered that, even if the recessed portion 21a becomes shallower due to the conductor material 21 being thickened, the alignment key 20 can be accurately recognized by the stepper.

As experiments, multiple types of multilayer structures were formed, and investigated in regard to the surface image, half width, and surface roughness Ra. Specifically, the following structures (1) to (4) were formed. In the structure (1), BPSG, Ti/TiN, and AlSi were sequentially formed on SiC. In the structure (2), Ti/TiN and AlSi were directly formed on SiC. In the structure (3), BPSG, Ti/TiN, and AlSi were sequentially formed on Si instead of SiC. In the structure (4), Ti/TiN and AlSi were directly formed on Si. In each of the structures (1) to (4), the film thickness of AlSi is set to 6 μm assuming of a case where it is applied to a power device. The results are shown in FIG. 5.

As shown in FIG. 5, in the structure where Ti/TiN and AlSi are sequentially formed on SiC via BPSG, as in the structure (1) shown as a comparative example, the surface image indicates that the crystallinity is deteriorated like cracks. In the structure (3) where Ti/TiN and AlSi are sequentially formed on Si, instead of SiC, via BPSG, the similar results to those in the structure (1) are obtained.

On the other hand, in the structure where Ti/TiN and AlSi are directly formed on SiC as in the structure (2) having the same structure as that of the present embodiment, the surface image indicates that the crystallinity is excellent and there are no poorly crystalline portions. In the structure (4) where Ti/TiN and AlSi are directly formed on Si instead of SiC, the surface image indicates that the crystallinity is deteriorated like cracks.

The half width of the structure (1) was 15.2764°. The half width of the structure (2) was 0.4386496°. The half width of the structure (3) was 14.61398°. The half width of the structure (4) was 7.328217°.

The half width is obtained from the rocking curve measurement result by X-ray diffraction (XRD). In the locking curve measurement, monochromatic X rays with excellent parallelism are applied to a sample to be measured from a fixed position, and reflected X rays are measured by a detector arranged at a fixed position. The locking curve measurement is used to evaluate crystallinity, deformation and the like based on a diffraction intensity curve measured. Further, in the locking curve measurement, the crystal lattice strain can be evaluated by forming a reciprocal lattice map by scanning the vicinity of the incident/diffraction angle satisfying the diffraction conditions while rotating the sample. For example, the sample is rotated so that an incident angle is set to be w, and the angle formed by a detection direction of the detector for detecting the reflected X-rays with respect to the incident direction of the incident X-rays is set to 28. The measurement is performed by rotating the sample with the angle 28 constant while varying the angle ω. In the case of AlSi, the angle ω is set in the range of −25° to 25° in order to measure the Al (111) orientation.

Figure 6:
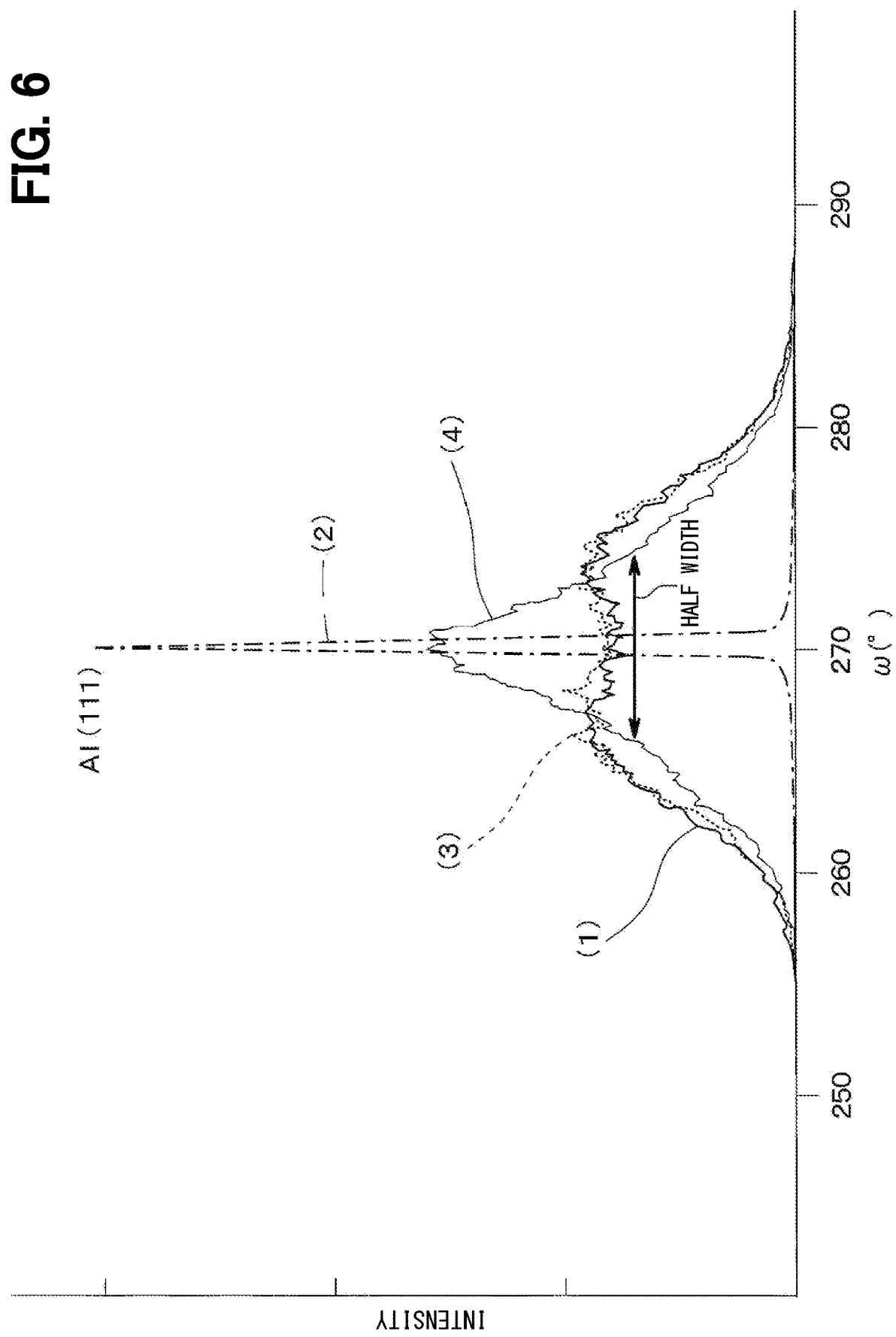
FIG. 6 is a graph showing a locking curve measurement result and a method of obtaining a half width.

By this locking curve measurement, the reciprocal lattice map is observed and the orientation of AlSi, which is the outermost surface, is estimated. That is, in a case where the orientation is not excellent and the plane orientation fluctuates, for example, if the wafer constituting the base layer is curved or the plane orientation is not aligned, the rocking curve measurement result shows the peak spread in the orientation of the measurement target. On the contrary, in a case where the orientation is excellent and the fluctuation of the plane orientation is small, the rocking curve measurement result has a peak less spread in the orientation of the measurement target. The diffraction intensity is obtained by conducting wedge-shaped integration of the rocking curve measurement result of the peak of Al (111), and the half width is obtained based on the intensity map thereof. FIG. 6 is an intensity map of the structures (1) to (4) created based on the locking curve measurement result, and the values of the half width in FIG. 5 are obtained from the map of FIG. 6. The half width indicated by an arrow in FIG. 6 shows the half width of the structure (4) as an example.

Since the crystallinity is not good when the half width exceeds 5°, it is required that the half width is 5° or less, and preferably 1° or less. As can be seen from FIG. 5, in the structure (2), the half width is 1° or less. Thus, it is appreciated that excellent results are obtained.

In regard to the surface roughness Ra, the surface roughness of the structure (1) was 20.504 nm. The surface roughness Ra of the structure (2) was 3.748 nm. The surface roughness Ra of the structure (3) was 9.578 nm, and the surface roughness Ra of the structure (4) was 19.671 nm. In this case, the surface roughness Ra was obtained from the results of measuring the surface heights of a large number of points in the range of 400 µm☐.

The surface roughness Ra is also an index for estimating the crystallinity. The better the crystallinity is, the smaller the surface roughness Ra is. The worse the crystallinity is, the larger the surface roughness Ra is. Further, in order to accurately recognize the alignment key 20, it is preferable that the surface roughness Ra has a smaller value. Specifically, the surface roughness Ra is preferably 5 nm or less. If the surface roughness Ra is 20 nm or more, it is difficult to accurately recognize the alignment key 20. From the above results, in the structure (2), the surface roughness Ra is 5 nm or less, which enables the alignment key 20 to be accurately recognized.

In regard to the surface roughness Ra, as the film thickness of the conductor material 21 increases, the surface roughness due to the uneven orientation is likely to increase. Specifically, when the film thickness of the conductor material 21 is 1 µm or more, the surface roughness Ra is likely to easily increase. When the film thickness of the conductor material 21 is large as in a power device, the surface roughness Ra can be particularly a large value. On the other hand, in this experiment, even if the film thickness of AlSi used as the conductor material 21 is as thick as 6 µm, the surface roughness Ra of the structure (2) can be suppressed to a small value of 5 nm or less.

Therefore, it is appreciated that the alignment key 20 can be accurately recognized even in a SiC semiconductor device such as a power device in which the film thickness of the conductor material 21 is large.

As a reference, the surface roughness Ra of the BPSG when the BPSG is simply placed on the SiC is 0.339 nm, and the surface roughness Ra of the BPSG when the BPSG was placed on the Si is 0.382 nm. From these results, it is considered that the surface roughness Ra of each of the above structures (1) to (4) is a value caused by the uneven orientation of the conductor material 21 and is not affected by the surface roughness Ra of the base.

As described above, in the present embodiment, the interlayer insulating film 10 is removed in and around the region corresponding to the alignment key 20, which is used for mask alignment when patterning the conductor material 21, and the conductor material 21 is placed thereon. As a result, the reading accuracy when recognizing the alignment key 20 using the stepper can be improved, and the alignment key 20 can be recognized accurately. Therefore, the mask alignment can be performed accurately, and the source electrode 11 and the gate wiring layer can be accurately formed at desired positions.

When the source electrode 11 is formed, in order to reduce the contact resistance with the n-type SiC, a nickel (Ni) layer is formed on the surface of the $n^+$-type source region 5 and then subjected to a heat treatment to obtain Ni silicide. In that case, after forming and silicidizing the Ni layer, the interlayer insulating film 10 may be removed again in and around the region corresponding to the alignment key 20 to form the opening, so that the Ni silicide is not formed in the region corresponding to the alignment key 20. For example, when the gate electrode 9 is p-type doped, a contact hole for electrical connection of the gate wiring layer is formed separately from the contact hole for the source electrode 11. In this case, if an opening is formed at the same time in the interlayer insulating film 10 in and around the region corresponding to the alignment key 20, the manufacturing process can be simplified.

Other Embodiments

While the present disclosure has been described in accordance with the embodiment described above, the present disclosure is not limited to the embodiment and includes various modifications and equivalent modifications.

Furthermore, various combinations and aspects, and other combination and aspect including only one element, more than one element or less than one element, are also within the sprit and scope of the present disclosure.

(1) In the embodiment described above, the configuration in which the Al-containing layer is formed on Ti/TiN in order to improve adhesion and obtain a barrier metal effect has been described as an example. However, Ti/TiN is not always necessary, and the present disclosure can be applied to the patterning of the conductor material 21 including at least the Al-containing layer.

Figure 7:
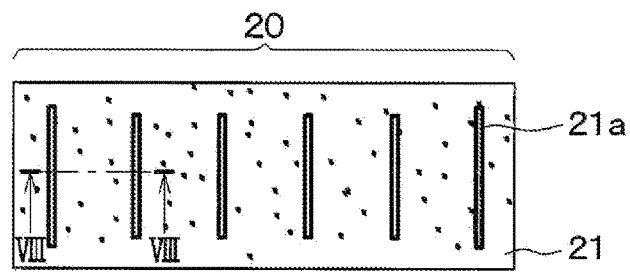
FIG. 7 is a diagram showing a top layout of an alignment key according to another embodiment.

(2) In the embodiment described above, the configuration in which the alignment key 20 is provided by the recessed portions 21a has been described. However, the alignment key 20 may alternatively have the following three types. For example, in the case where the alignment key 20 may be provided by multiple lines as shown in FIG. 7, the alignment key 20 have the cross sections as shown in FIGS. 8A to 8C, when taken along a line VIII-VIII in FIG. 7.

Figure 8A:
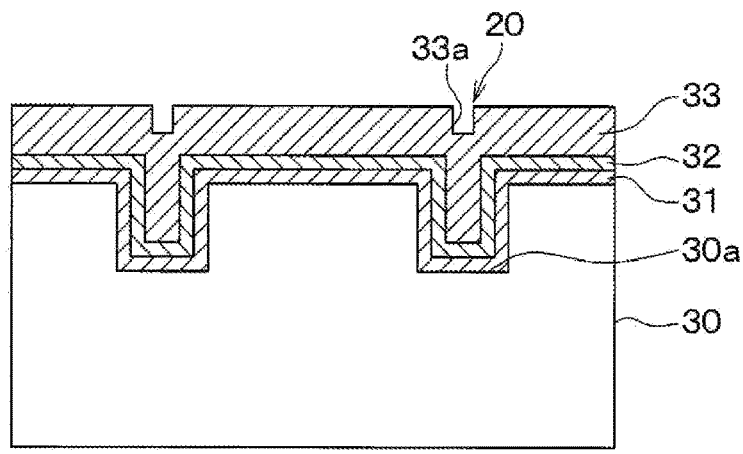
FIG. 8A is a cross-sectional view of a semiconductor device in which an alignment key is provided by a recess as an example.

FIG. 8A shows the structure described as in the first embodiment, in which the alignment key 20 is provided by forming recessed portions 30a in a SiC layer 30 as a semiconductor layer. In this structure, when a Ti layer 31, a TiN layer 32 and an Al-containing layer 33 such as AlSi are formed on the SiC layer 30, a recessed portion 33a derived the recess 30a is also formed in the Al-containing layer 33, and thus the recessed portion 33a can be used as a new alignment key 20.

In a case where the alignment key 20 is recognized by a stepper based on the height difference of the recessed portion 33a, it is preferable that the height difference is 1 µm or more. For this reason, the depth of the recess 30a formed in the SiC layer 30 is preferably determined so that the depth of the recessed portion 33a remaining after forming the Al-containing layer 33 is 1 µm or more.

Figure 8B:
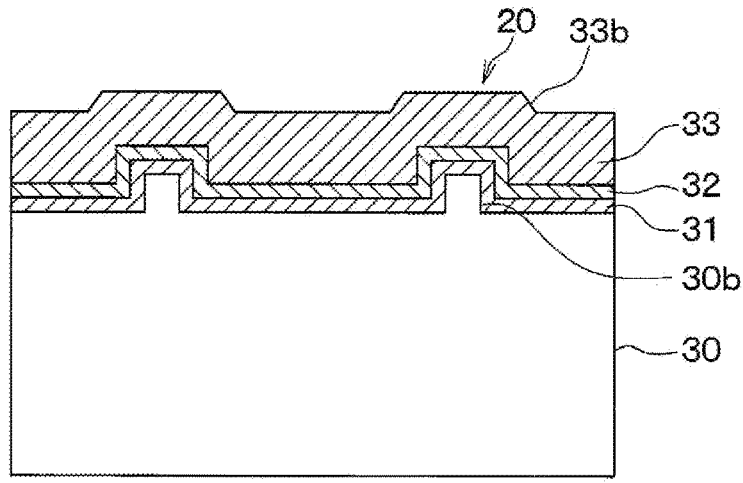
FIG. 8B is a cross-sectional view of a semiconductor device in which an alignment key is provided by a projection as another example.
Figure 8C:
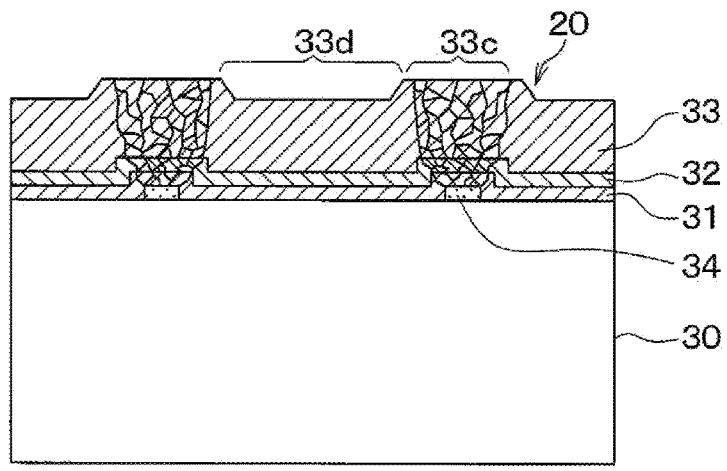
FIG. 8C is a cross-sectional view of a semiconductor device in which an alignment key is provided by different material parts as further another example.

In the example of FIG. 8B, projections 30b are formed on the SiC layer 30 as the alignment key 20. For example, the projections 30b may be formed by depressing a periphery of the region corresponding to the alignment key 20 in the SiC layer 30 by etching. In this example, in the case where the Ti layer 31, the TiN layer 32, and the Al containing layer 33 such as AlSi layer are formed on the SiC layer 30, a projection 33b derived from the projection 30b is also formed in the Al containing layer 33, and thus this projection 33b can be used as a new alignment key 20.

Also in a case where the alignment key 20 is recognized by the stepper based on the height difference due to the projection 33b, it is preferable that the height difference is 1 µm or more. Therefore, it is preferable that the height of the projection 30b formed on the SiC layer 30 is determined so that the height of the projection 33b remaining after forming the Al-containing layer 33 is 1 µm or more. In the example of FIG. 8C, a dissimilar material portion 34, which is made of a material different from SiC, is formed on the surface of the SiC layer 30 so as to serve as an alignment key 20. For example, an oxide film is formed on the surface of the SiC layer 30 and patterned to form a dissimilar material portion 34. In this example, in a case where the Ti layer 31, the TiN layer 32 and the Al containing layer 33 such as AlSi are formed on the dissimilar material portion 34, a part 33c formed on the dissimilar material portion 34 has a crystallinity and a surface roughness Ra different from other part. Therefore, when being recognized by the stepper, since the reflectance is different between the part 33c having poor crystallinity and the part 33d having excellent crystallinity formed on the SiC layer 30, the part 33c can be used as a new alignment key 20.

When the alignment key 20 is recognized by the stepper based on the difference in crystallinity due to the dissimilar material portion 34, the SN ratio does not deteriorate even if the height is not 1 μm or more because it is not based on the height difference. Therefore, the height of the dissimilar material portion 34 formed on the SiC layer 30 is arbitrary.

In the configuration where the dissimilar material portion 34 is used as the alignment key 20, since the dissimilar material portion 34 is formed on the SiC layer 30, the dissimilar material portion 34 is formed after impurity layers for forming semiconductor elements are formed in the SiC layer 30. Therefore, the recesses 30a or the projections 30b are used as the alignment key 20 when forming respective impurity layers for constituting semiconductor elements with respect to the SiC layer, and the dissimilar material portion 34 is used as the alignment ley 20 when patterning the conductor material 20. For example, when the interlayer insulating film 10 is patterned, the interlayer insulating film 10 may be partially left in the region used as the alignment key 20, and the dissimilar material portion 34 is formed using the interlayer insulating film 10 partially left.

As described above, the alignment keys 20 having various structures shown in FIGS. 8A to 8C can be used. Even if the structures of the alignment keys 20 are different, the similar effects to those of the first embodiment can be achieved by the respective alignment keys 20.

Although the SiC layer 30 has been described as the semiconductor layer, the semiconductor layer is assumed to be a semiconductor in a portion where the semiconductor element is formed and the conductor material 21 is brought into contact with the semiconductor layer. The semiconductor substrate itself can be the semiconductor layer.

(3) In the embodiment described hereinabove, an n-channel type vertical MOSFET in which the first conductivity type is n-type and the second conductivity type is p-type has been described as an example of the semiconductor element. The present disclosure can also be applied to a configuration in which other semiconductor element is formed.

(4) In the embodiment described hereinabove, the configuration in which a line-shaped alignment key 20 is used has been described as an example. Alternatively, the alignment key 20 is not limited to the line-shaped alignment key, and may have another shape, for example, a dot shape.

(5) In the embodiment described hereinabove, the SiC semiconductor device has been described as an example of the semiconductor device. The present disclosure can also be applied to a semiconductor device using Si as a semiconductor material. For example, the embodiment described hereinabove can also be applied to a wide band gap semiconductor device, for example, a semiconductor device using GaN, diamond, or the like.

What is claimed is:

1. A method for manufacturing a semiconductor device, comprising:
    forming an insulating film on a surface of a semiconductor layer of a semiconductor substrate, including a region corresponding to an alignment key formed on the surface of the semiconductor layer, the alignment key having a stripe pattern including a plurality of lines;
    forming a contact hole in the insulating film;
    removing a part of the insulating film including the region corresponding to the alignment key including the plurality of lines and a periphery of the region so as to expose the semiconductor layer;
    forming a conductor material on the insulating film and directly on the semiconductor layer exposed by the removing the part of the insulating film, the conductor material being in contact with the semiconductor layer through the contact hole and where the part was removed; and
    patterning the conductor material using the alignment key inherited to a surface of the conductor material as a reference, wherein
    the plurality of lines of the alignment key is provided by a plurality of recessed portions formed in the surface of the semiconductor layer, and
    the periphery of the region is defined along the surface of the semiconductor layer of the semiconductor substrate outside of and around the recessed portions.

2. The method according to claim 1, wherein
    the alignment key formed on the surface of the semiconductor layer is a recessed portion, and
    the patterning of the conductor material using the alignment key is performed by using, as a new alignment key, a recessed portion inherited to the surface of the conductor material from the recessed portion formed on the surface of the semiconductor layer.

3. The method according to claim 2, wherein
    in the patterning of the conductor material, the recessed portion inherited to the surface of the conductor material as the new alignment key has a depth of 1 micrometer or more.

4. The method according to claim 1, wherein
    the removing the part of the insulating film to expose the semiconductor layer is performed at a same time as the forming the contact hole.

5. The method according to claim 1, wherein
    the forming the conductor material includes forming an Al-containing layer containing aluminum as the conductor material.

6. The method according to claim 5, further comprising:
    preparing the semiconductor substrate having the semiconductor layer in which a main surface has a (111) orientation and a lattice constant is 2.5 nm to 3.5 nm.

7. The method according to claim 5, wherein
    the forming the conductor material includes forming a Ti layer to be in contact with the semiconductor layer, and forming a TiN layer on the Ti layer, and
    the forming of the Al-containing layer is performed after the forming the Ti layer and the forming the TiN layer.

8. The method according to claim 1, wherein
    the forming the conductor material is performed so that the conductor material formed directly on the semiconductor layer has a surface roughness of 5 mm or less.

9. The method according to claim 1, wherein
    the forming the conductor material is performed so that the conductor material has a thickness of 1 micrometer or more.

10. A method for manufacturing a semiconductor device, comprising:
    forming an insulating film on a surface of a semiconductor layer of a semiconductor substrate, including a region corresponding to an alignment key formed on the surface of the semiconductor layer, the alignment key having a stripe pattern including a plurality of lines;
    forming a contact hole in the insulating film;

removing a part of the insulating film including the region corresponding to the alignment key including the plurality of lines and a periphery of the region so as to expose the semiconductor layer;

forming a conductor material on the insulating film and directly on the semiconductor layer exposed by the removing the part of the insulating film, the conductor material being in contact with the semiconductor layer through the contact hole and where the part was removed; and patterning the conductor material using the alignment key inherited to a surface of the conductor material as a reference, wherein the plurality of lines of the alignment key is provided by a plurality of projections projecting on the surface of the semiconductor layer, and the periphery of the region is defined along the surface of the semiconductor layer of the semiconductor substrate around the projections.

11. The method according to claim 10, wherein the alignment key formed on the surface of the semiconductor layer is a projection, and the patterning of the conductor material using the alignment key is performed by using, as a new alignment key, a projection inherited to the surface of the conductor material from the projection formed on the surface of the semiconductor layer.

12. The method according to claim 11, wherein in the patterning of the conductor material, the projection inherited to the surface of the conductor material as the new alignment key has a height of 1 micrometer or more.

13. A method for manufacturing a semiconductor device, comprising:

forming an insulating film on a surface of a semiconductor layer of a semiconductor substrate;

forming a contact hole in the insulating film;

removing a part of the insulating film corresponding to a periphery of an alignment key so as to expose the semiconductor layer on the periphery of the alignment key while leaving the insulating film in a region corresponding to the alignment key to form a dissimilar material portion;

forming a conductor material on the insulting film to be in contact with the semiconductor layer through the contact hole and directly on the semiconductor layer exposed from the insulating film and the dissimilar material portion; and patterning the conductor material using a part of the conductor material formed directly on the dissimilar material portion, as a new alignment key, based on a difference in crystallinity between the part of the conductor material formed directly on the dissimilar material and a part of the conductor material formed directly on the semiconductor layer exposed from the insulating film.

14. The method according to claim 13, wherein the forming the conductor material includes forming an Al-containing layer containing aluminum as the conductor material.

15. The method according to claim 14, further comprising:

preparing the semiconductor substrate having the semiconductor layer in which a main surface has a (111) orientation and a lattice constant is 2.5 nm to 3.5 nm.

16. The method according to claim 14, wherein the forming the conductor material includes forming a Ti layer to be in contact with the semiconductor layer, and forming a TiN layer on the Ti layer, and the forming of the Al-containing layer is performed after the forming the Ti layer and the forming the TiN layer.

17. The method according to claim 13, wherein the forming the conductor material is performed so that the conductor material formed directly on the semiconductor layer has a surface roughness of 5 mm or less.

18. The method according to claim 13, wherein the forming the conductor material is performed so that the conductor material has a thickness of 1 micrometer or more.

* * * * *